(12) United States Patent  
Vigier-Blanc et al.

(10) Patent No.: US 8,575,712 B2  
(45) Date of Patent: Nov. 5, 2013

(54) MANUFACTURING OF A CAMERA MODULE

(75) Inventors: Emmanuelle Vigier-Blanc, Le Sappey en Chartreuse (FR); Jean-Luc Jaffard, Saint Egreve (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 132 days.

(21) Appl. No.: 13/315,018

(22) Filed: Dec. 8, 2011

(65) Prior Publication Data

US 2012/0146170 A1    Jun. 14, 2012

Related U.S. Application Data

(63) Continuation-in-part of application No. PCT/EP2010/057940, filed on Jun. 7, 2010.

(30) Foreign Application Priority Data

Jun. 8, 2009  (EP) ..................................... 09305520

(51) Int. Cl.  
*H01L 31/0232*  (2006.01)

(52) U.S. Cl.  
USPC ........................................................ 257/432

(58) Field of Classification Search  
USPC .................... 257/13, 79–103, 918,  
257/E51.018–E51.022, E31.058, E31.063,  
257/E31.115, E25.032, E27.133–E27.139,  
257/678–733, 787–796, E23.001–E23.194,  
257/116, 117, 432–437  
See application file for complete search history.

(56) References Cited

U.S. PATENT DOCUMENTS

| | | | |
|---|---|---|---|
| 7,408,205 B2* | 8/2008 | Webster et al. | 257/99 |
| 7,613,389 B2* | 11/2009 | Suzuki et al. | 396/89 |
| 7,932,529 B2* | 4/2011 | Lin et al. | 257/98 |
| 8,351,219 B2* | 1/2013 | Lin et al. | 361/818 |
| 2002/0126940 A1 | 9/2002 | Kathman et al. | |
| 2005/0275750 A1* | 12/2005 | Akram et al. | 348/374 |
| 2006/0030079 A1 | 2/2006 | Huang et al. | |
| 2006/0088980 A1 | 4/2006 | Chen et al. | |
| 2007/0040932 A1* | 2/2007 | Chen | 348/374 |
| 2007/0047938 A1* | 3/2007 | Suzuki et al. | 396/89 |
| 2007/0051877 A1* | 3/2007 | Sakai et al. | 250/214 R |
| 2007/0052827 A1 | 3/2007 | Hiltunen | |
| 2008/0246066 A1 | 10/2008 | Lake | |
| 2010/0019340 A1 | 1/2010 | Shibayama | |

FOREIGN PATENT DOCUMENTS

WO    2008/081950 A1    7/2008

* cited by examiner

*Primary Examiner* — Dao H Nguyen  
*Assistant Examiner* — Tram H Nguyen  
(74) *Attorney, Agent, or Firm* — Seed IP Law Group PLLC

(57) ABSTRACT

A camera module includes a sensor die, a glass plate, peripheral spacer, an optical element, an outer surface having a shoulder extending in a direction substantially parallel to the sensor die, and a metal layer at least partially covering the outer surface. A method of manufacturing a camera module includes providing an assembly including a sensor dice wafer, a spacer wafer in front of the sensor dice wafer, and an optical element wafer in front of the spacer wafer. The method includes sawing a top cut, using a first saw blade of a first thickness, proceeding in a direction from the optical element wafer toward the sensor dice wafer, stopping before the sensor dice wafer is reached, and sawing a bottom cut, using a second saw blade of a second thickness, proceeding in a direction from the sensor dice wafer toward the optical element wafer.

21 Claims, 7 Drawing Sheets

MANUFACTURING OF A CAMERA MODULE

BACKGROUND

1. Technical Field

The present disclosure relates to camera modules, in particular those manufactured using techniques known in the field of microelectronics.

2. Description of the Related Art

There are many applications for cameras were size is at a premium. Common examples of these are mobile phones and other mobile multimedia devices, though other applications also exist. To satisfy these demands, miniature camera modules are manufactured using microelectronics techniques.

Such modules often use sensors made using semiconductor technology, for example CMOS (complementary metal oxide semiconductor) or CCD (charge coupled device) technologies. These sensors come in the form of arrays of sensor cells on a piece of silicon, sometimes in association with some image processing circuitry. These sensors are very sensitive to light and to electromagnetic interference.

Stray light can saturate the sensor. Electromagnetic fields, when strong enough, can also disturb the functioning of the detectors cells. The result, in both cases, is the degradation, to a greater or lesser degree, of the image being generated by the sensor.

It is, therefore, desirable to protect the sensor and from electromagnetic fields and to ensure that the only light incident on the sensor is that which has passed via the optics.

Furthermore, in many situations, there is significant pressure to minimize the cost of the camera module.

FIG. 1 represents a cross-section of a miniature camera module 1 manufactured using known techniques.

A sensor die 2 has a lower surface to which are attached solder balls 3, for connections to a circuit board (not shown). On a top surface of the sensor die, there is arranged a sensor array 4 having attached to it micro-lenses 5.

In order to produce color sensors, a color filter mask (not shown) is placed in front of the sensor array 4. This mask contains areas of color filter placed at the same pitch as the individual sensor cells, such that each sensor cell has its own color filter in front of it. The color filters for neighboring cells are of a different primary color, for example red, green and blue. When the image is processed, the information from each of the groups of neighboring cells, typically four cells, is combined into information for a single pixel of the image. Thus the final image has ¼ the resolution of the actual sensor array.

In an area outside the sensor array, attached to the upper surface of the sensor die are small spacers 6. The small spacers are also attached to a lower surface of the glass plate, known as a cover class 7, such that the cover glass 7 is held parallel to and at a small distance above the sensor die 2. The purpose of the cover glass 7 is to protect the surface of the sensor array 4 from particles, particularly those generated during the assembly processing.

On an upper surface of the cover glass 7, there is attached a lower end of a spacer element 8. The spacer element 8 has a tubular or box cross-section and contacts the cover glass in an area outside sensor array.

To an upper end of the space element 8 there is attached an optical element 9, having focusing means, such as a lens assembly 10. The focusing means 10 is aligned with the sensor array.

To an upper surface of the optical element 9 is attached an aperture mask 11 forming an opening aligned with the focusing means 10 and the sensor array 4. The purpose of the aperture mask 11 is to prevent phantom images being created by rays of high incident angle, particularly those passing through the extremities of the focusing means 10.

The spacer element 8 has the purpose of placing the focusing means 10 on the optical element 9 at the correct operating distance from the sensor array 4. This distance is a function of a number of parameters such as the overall size of the sensor array 4, the density of cells in the sensor array 4 and the optical properties of the focusing means 10.

A shielding element 12 surrounds in the assembly of the sensor die 2, the cover glass 7, the spacer element 8, the optical element 9, and the aperture mask 11. The shielding element 12 is attached to the lower surface of the sensor die by a suitable means such as crimping and conductive glue 13. The top surface of the shielding element 12 has an aperture aligned with that of the aperture mask.

The purpose of the shielding element 12 is to prevent electromagnetic interference and to stop light entering the side of the camera module. In order to fulfill these functions effectively, it is both opaque and conductive, and is often made of a metal foil. In order to obtain an effective faraday cage, the shielding element 12 is connected to a ground connection via the conductive glue 13.

The presence of the shielding element increases the volume occupied by the camera module, particularly in the x-y directions. Furthermore it represents an additional cost in terms of both the material itself and the time-consuming assembly steps to put it in place. There may also be a yield loss associated with this part of the process.

The shielding element 12 represents an increase in weight. In order to mitigate this, it is possible to make the foil thin. However this has the disadvantage of making the shielding element fragile. Also, as described previously, the shielding element is attached by crimping and gluing. The joint is, to a certain extent, fragile.

This is of concern for the manipulation steps for assembly of the camera module 1 on to the printed circuit board, and significant care is taken to avoid yield loss at this step.

Traditionally, such camera modules have been assembled as individual units. For example, a spacer element 8 is placed on a sensor die 2+cover glass 7 sub-assembly and an optical element 9 added thereon. Were these steps to be performed collectively, a significant economy in manufacturing cost could be obtained.

The US patent application published as 2007/0052827 describes a method of coating the outside of a camera module. However there is no teaching of how to integrate this into an industrial assembly flow, or indeed much detail of such a flow. Nor is there any indication of the impact on the manipulation of the coated camera.

It is therefore desirable to provide a miniature camera module which is smaller and more robust. It is also desirable that the camera module be of lower cost in terms of materials and manufacturing, and be easier to assemble onto the printed circuit board of the equipment for which it is intended.

BRIEF SUMMARY

One embodiment is a method of manufacturing a camera module which comprises the steps of: providing an assembly comprising a sensor die wafer, a spacer wafer and an optical element wafer, said spacer wafer being placed in front of said sensor die wafer and said optical element wafer being placed in front of said spacer wafer; sawing a top cut, using a first saw blade of a first thickness, proceeding in a direction from said optical element wafer toward said sensor die wafer, stopping before said sensor die wafer is reached, and sawing a bottom cut, using a second saw blade of a second thickness, proceeding in a direction from said sensor die wafer toward said optical element wafer.

According to an embodiment the method further comprises the steps of placing a metal coating on a surface exposed by said top cut and placing a metal coating on a surface exposed by said bottom cut.

According to an embodiment, the step of sawing the top cut is stopped in the thickness of said spacer wafer.

According to an embodiment, the sawing of said bottom cut is continued until said bottom cut communicates with said top cut.

According to an embodiment, the step of pacing a metal coating on the exposed surface of said top cut also forms an aperture on an upper surface of said optical element wafer.

According to another embodiment, the top cuts that communicate with said bottom cuts are located between every second sensor die.

There is provided, a camera module, having an outer surface, which comprises: a sensor die; a glass plate; a peripheral spacer; and an optical element, wherein the profile of said outer surface has a shoulder extending around said outer surface in a direction substantially parallel to the plane of said sensor die, and said outer surface is at least partially covered by a deposited metal layer.

According to an embodiment, the peripheral spacer has a thickness variation in a direction parallel to the plane of said sensor die such that said shoulder is formed in said peripheral spacer.

According to an embodiment, the sensor die has conductive columns connecting the top and the bottom surfaces of the sensor die.

According to an embodiment, the module of claim 7 further comprises an aperture layer.

There is also provided, a camera module which comprises: a plurality of pixel arrays; a peripheral spacer element, having an outer surface, said peripheral spacer being arranged around said module and between each pixel array; a plurality of optical elements, at least one of each optical elements being arranged in front of a pixel array, and a plurality of color filters, one of each of said color filters being arranged in front of one of each of said pixel arrays, wherein each of said color filters is adapted to transmit a single color and at least two of said sensor dice have color filters adapted to transmit different colors.

According to an embodiment, the surface has a shoulder extending around said outer surface in a direction substantially parallel to the plane of said sensor die.

According to an embodiment, the sensor arrays are on separate sensor die.

According to an embodiment, the surfaces of said sensor die located between said sensor die have a metal coating.

According to an embodiment, all of the transparent elements arranged in front of one of said sensor arrays are able to transmit infra-red radiation, such that said sensor array is able to form images using said infra-red radiation.

BRIEF DESCRIPTION OF THE SEVERAL VIEWS OF THE DRAWINGS

The foregoing and other purposes, features, aspects and advantages of the disclosure will become apparent from the following detailed description of embodiments, given by way of illustration and not limitation with reference to the accompanying drawings.

FIG. 2c represents a variant of part of the assembly flow of FIG. 2a;

DETAILED DESCRIPTION

In the following description and drawings, same references designate same elements.

Figure 2A:
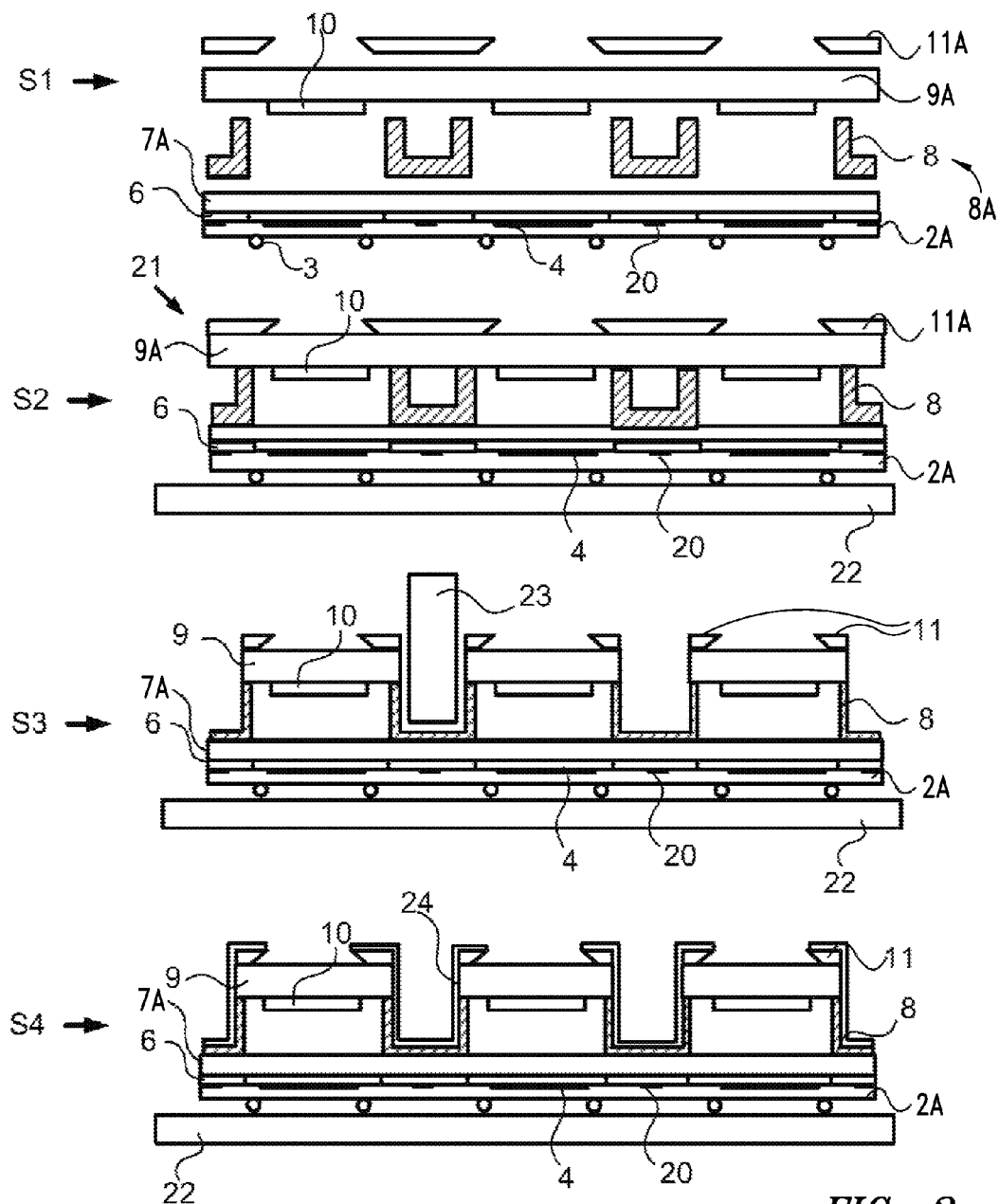
FIGS. 2a and 2b represent an assembly flow according to an embodiment.

FIG. 2a represents a first part of an assembly flow in terms of cross-sectional views of the elements to be assembled.

At step S1, a sensor die wafer 2A, a cover glass wafer 7A, a spacer element wafer 8A, an optical element wafer 9A, and an aperture mask wafer 11A are all presented in a collective forms equivalent to that of wafers. The horizontal pitches of spacer elements 8 of the spacer element wafer 8A, optical elements 9 of the optical element wafer, and aperture masks 11 of the aperture mask wafer are chosen to correspond to the pitch of the sensor dice 2 of the sensor die wafer, so that satisfactory alignment of the same will be obtained at the end. The spacer element wafer 8A is constructed so that vertical center-lines of the individual spacer elements 8 lie substantially above the centers of scribe lanes 20 of the sensor die wafer 2A.

The sensor die wafer 2A and cover glass wafer 7A have been previously assembled together using a structure of small spacers 6.

At step S2, the aforesaid elements are attached together using appropriate attachment techniques. A lower side of the wafer 8A of spacer elements 8 is attached to an upper side of the cover glass wafer 7A. The optical element wafer 9A is attached to an upper side of the spacer element wafer 8A.

The resulting wafer stack 21 is then mounted onto a support structure 22.

The wafer stack 21 must be cut in order to produce the individual units.

This part of the process presents two difficulties.

Firstly, the materials to be sawn are quite disparate. The optical element wafer 9A is often of a mineral glass, the aperture mask wafer 11A is of a composite material, FR4 for example, the spacer element wafer 8A is of an epoxy and the sensor die wafer 2A is silicon.

Secondly, the vertical distance down from the top of the aperture mask wafer 11A to the top of the sensor die wafer 2A is quite large, around 2 mm. This is a consequence of the fact that the optical element 9 works best when maintained at a certain distance from the sensor array 4.

In particular, this distance is large relative to the width of the cut. This situation becomes more extreme as the size of the sensor die 2 is reduced because the distance between the optical element and the sensor array does reduce in proportion. Indeed, an increase in either tends to lead to an increase in this distance.

It has been found that if the ratio of cutting radius (the part of the blade which is unsupported) to blade thickness approaches 20:1, the risk that the blade vibrates increases significantly. Such vibration can lead to damage in the materials such as chipping and cracking.

At step S3, partial sawing of the wafer stack 21 is performed. The aperture mask and optical element wafers 11A, 9A are sawn through to produce the aperture masks 11 and optical elements 9, down towards the cover glass wafer 7A, as shown by the cross-sectional representation of the circular saw blade 23. This is performed in rows aligned above the scribe lanes 20 of the sensor die wafer 2A. The saw-blade 23 is stopped either in the horizontal parts of the spacer elements 8 or inside the thickness of the cover glass wafer of 7A.

The saw blade 23 is chosen to be able to cut the glass of the optical element wafer 9A quickly and cleanly whilst not clogging up too much in the cutting of the aperture mask and spacer element wafers 11A, 8A.

In order to be sure of avoiding vibration of the saw-blade 23, a typical safe thickness of the saw-blade 23 will be about 250 μm. This is much wider than the scribe lanes 20, which are typically of the order of 100 μm wide. To adapt the scribe lane 20 width to that of the saw blade 23 would be uneconomic in that it would reduce too much the number of sensor dice 2 per wafer.

Thus it is possible to perform the operation in an acceptable time, while obtaining a satisfactory cut.

At step S4, the inner surfaces of the cuts are coated with metal coatings 24. It is advisable to place a protective mask over the apertures between the aperture masks 11 beforehand so as to protect the optical elements 9 from the metal deposition. One of ordinary skill will be able to perform this part of the process.

The metallization may be of the order of 5 to 25 μm thick and materials such as layer of copper followed by stainless steel can be used, though other choices are possible as long as the coating 24 is corrosion and scratch resistant. Indeed a non-metallic coating could also be used as long as it was sufficiently conductive and corrosion and scratch resistant.

The choice of deposition technique is conditioned by the requirements of step coverage and ability to coat the bottom of the deep groove. Chemical Vapor Phase and Plasma Vapor Deposition (PVD) are possibilities, though one of ordinary skill will be able to make this choice.

Figure 2B:
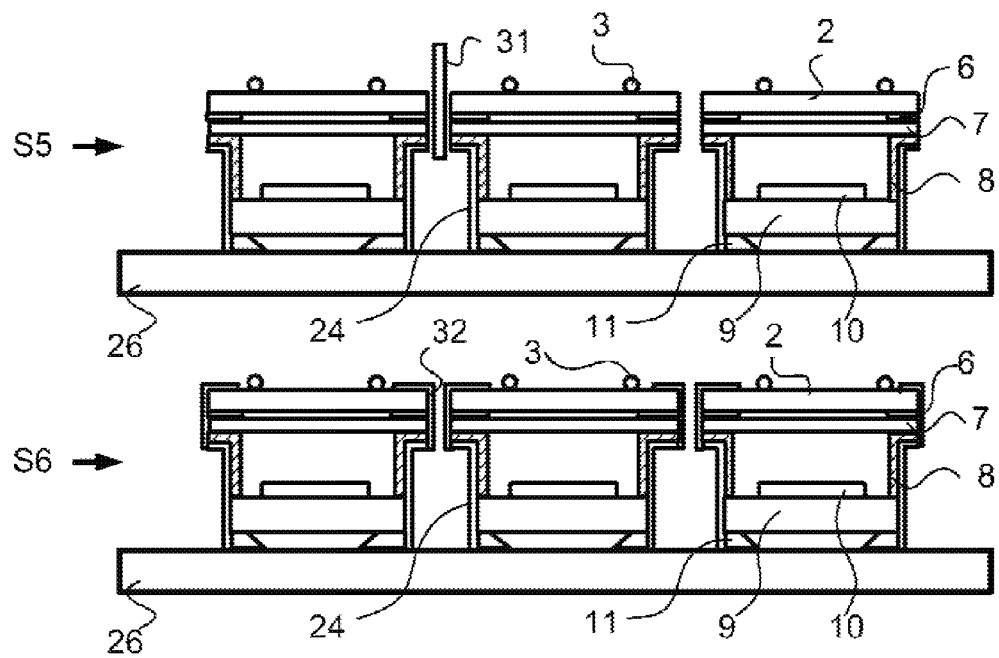

FIG. 2b represents a subsequent part of the process.

At step S5, the wafer stack 21 has been detached from the support structure 21, turned over and attached to another support structure 26. The sensor die and cover glass wafers 2A, 7A are sawn through along the scribe lanes 20 of the sensor die wafer 2A to produce the sensor dice 2 and cover glasses 7. The sawing is continued until the full thickness of the sensor die and cover glass wafers 2A, 7A have been cut and the cuts so produced communicate with those produced in the previous sawing process.

The saw blade 31 (shown in cross-section) is adapted for the cutting of silicon and glass. It will typically be around 50 μm thick.

At step S6, further metal coating 32 is deposited in a similar manner to the previous deposition. If there are areas of the bottom surface of the sensor dice 2 where coating is not wanted, for example the solder balls 3, a protective mask may be put in place beforehand.

It is possible to use the same composition and thickness as that used for the previous coating 24. However this is not a necessity and other choices are possible, as long as they are compatible with the form and surfaces of the groove and sufficient contact with the first coating 24 is made.

By placing ground connections on the bottom surface of the sensor die in such positions as to contact the metal coating 32, it is possible to have the metal coatings 24, 32 act as a faraday cage. Furthermore, the metal coatings 24, 32 are opaque so the sensor array 4 is protected from stray light beams. Since there is a join between the coatings 24, 32 at an overhanging edge, it may be useful to make the spacer element also opaque.

Figure 2C:
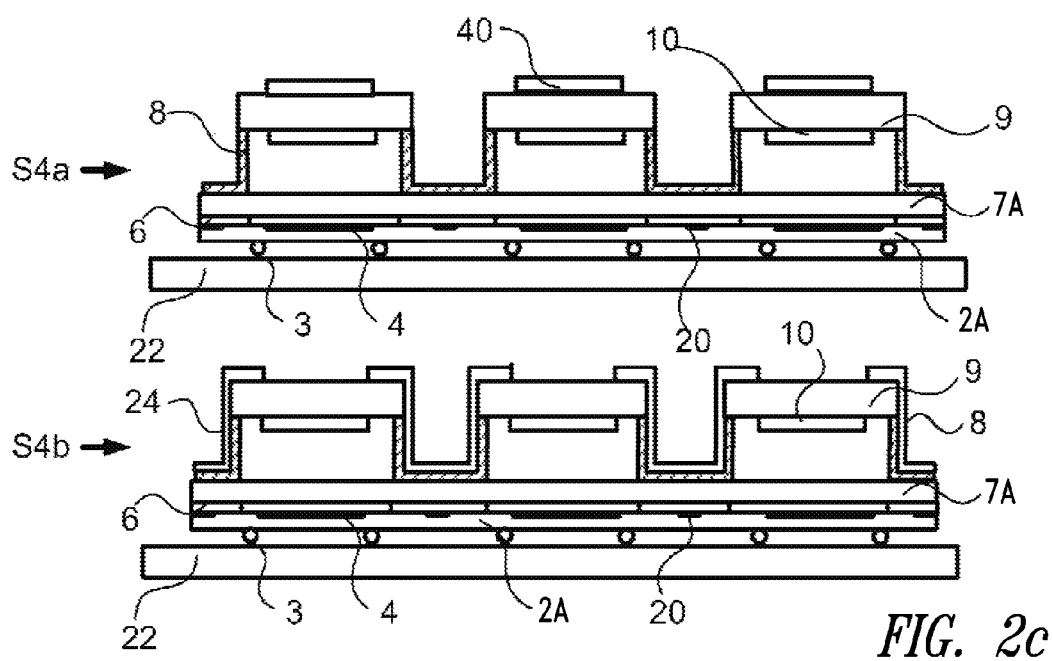

FIG. 2c represents an alternative flow for the steps concerning the deposition of the first metal coating 24.

The aperture masks 11 have been omitted.

At step S4a, a protective mask layer 40 is deposited. This could be the same as that mentioned previously, but dimensioned to ensure the correct aperture.

At step S4b, the metal coating 24 is deposited as described previously and then the protective mask layer 40 is removed.

This allows the economizing of the aperture mask 11 and the step of attaching thereof.

Figure 3:
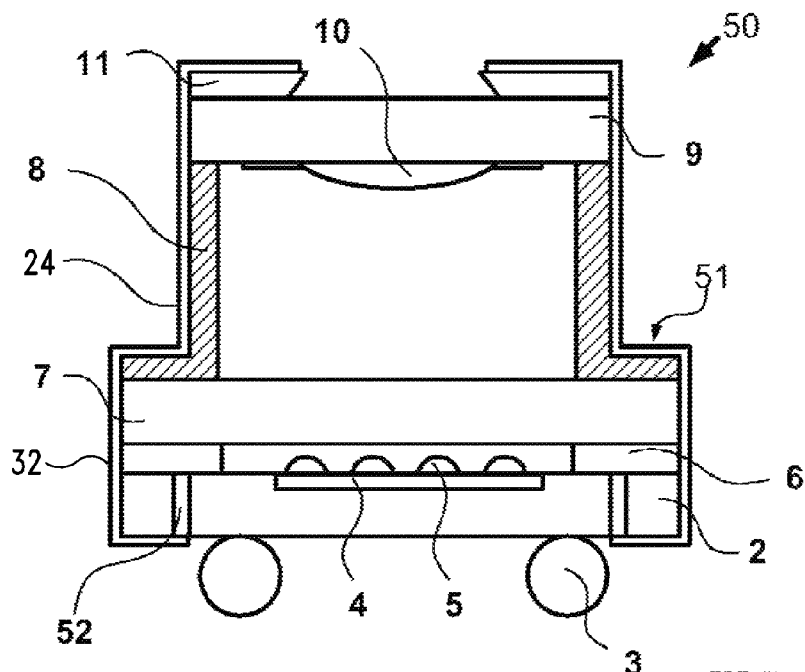
FIG. 3 represents a cross-section of a camera module according to an embodiment.

FIG. 3 represents a cross-section view of a camera module 50, according to an embodiment.

Figure 1:
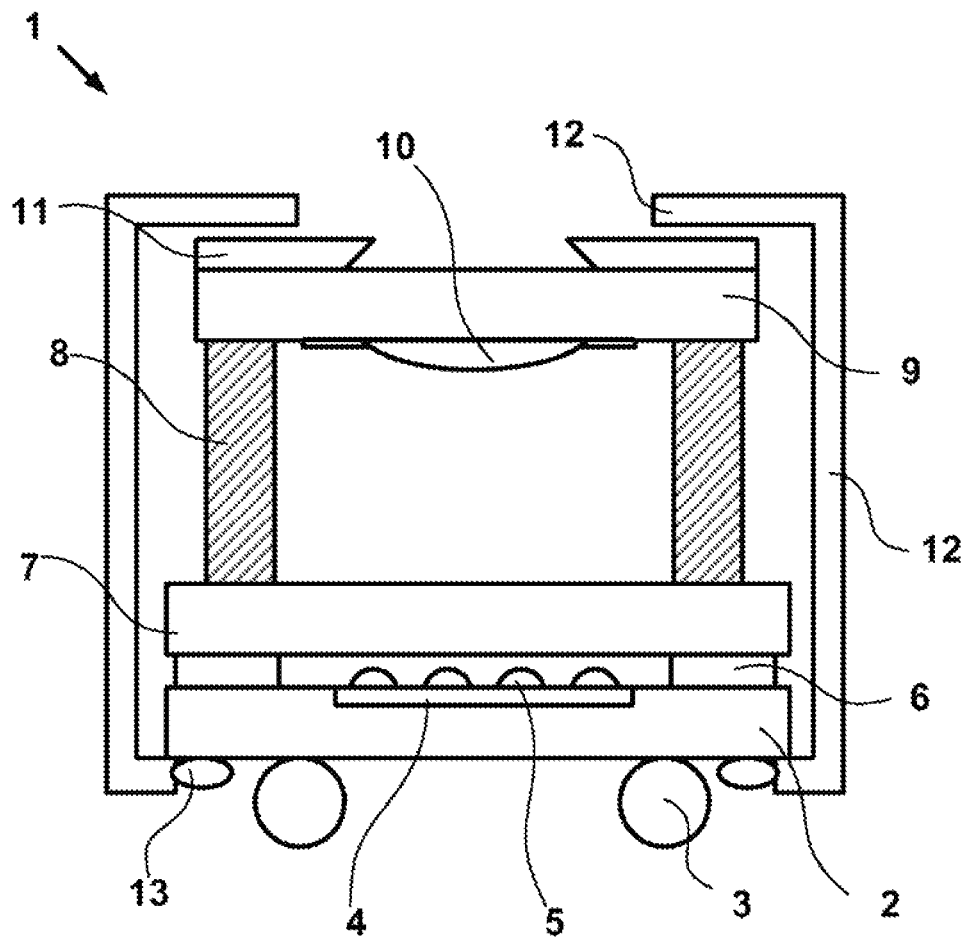
FIG. 1 represents a known miniature camera module.

The features common to FIG. 1 i.e., the sensor die 2, the sensor array 4, the micro-lenses 5, the small spacers 6, the cover glass 7, the spacer element 8, the optical element 9 and the aperture element 11, having been described previously, will not be described further.

The shielding element 13 of FIG. 1 has been replaced by the metal coating 24, 32 which extents from the aperture mask 11 down to the bottom surface of the sensor die 2. The metal coating 24, 32 is opaque and so protects the sensor array 4 from stray light. The metal coating 24, 32 contacts a ground connection on the bottom surface of the sensor die 2 and so may act as a faraday cage.

The sensor die 2 also has conductive columns 52 connecting the top surface to the bottom surface. These may be formed by boring holes through the sensor die with an appropriate technique, and placing conductive material inside the holes. As such the conductive columns are often known as 'thru-silicon vias'. The conductive columns 52 allow connections to the sensor array 4 which are cost effective and do not increase the size of the module.

The absence of the shielding element 13 of FIG. 1 means that the overall size of the camera module 50 has been reduced. Furthermore the cost of the shielding element 13 itself and that of the step of attaching it have been saved. Also a weight saving has been achieved.

The camera module 50 is more easily manipulated for assembly onto the printed circuit board because the exterior no longer presents the fragility associated with the shielding element 13.

Furthermore, the external form of the camera module 50 presents, in certain cases, a useful feature, in that the shoulder 51 can make easier the task of the optical alignment system of the equipment used for assembling the camera module 50.

Figure 4A:
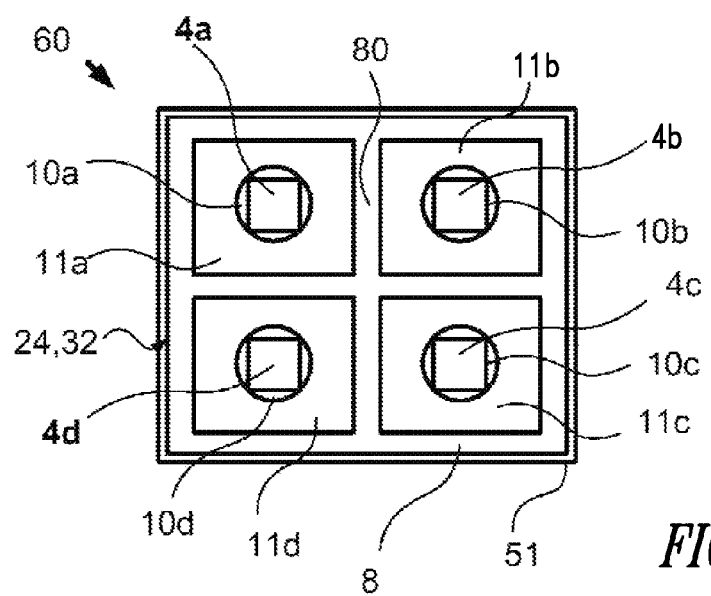
FIGS. 4a to 4c represent plan and cross-section views of a camera module according to another embodiment.

FIG. 4a represents plan view of a camera module having a matrix 60 of individual sensor arrays, produced using the method of FIGS. 2a-c.

The features common to the embodiment of FIG. 3 will not be described further.

Sensor dice 2a, 2b, 2c, 2d (below, not shown in this figure) are arranged in a matrix formation. Each die has a sensor array 4a, 4b, 4c, 4d, above which is arranged an optical element including its focusing lens assembly 10a, 10b, 10c, 10d and a corresponding aperture mask 11a, 11b, 11c, 11d.

Around the periphery of the matrix there is arranged at spacer element 8, having a shoulder 51. The spacer element 8 has also internal walls 80 between the individual sensor arrays array 4a, 4b, 4c, 4d. The external surface of the peripheral part of the spacer element 8 is coated as described previously with the metal coating 24, 32.

In general, CMOS sensor chips have an infra-red (IR) filter arranged in front of them because the sensor elements are very sensitive to IR to the extent that normal daylight levels of IR can impair the sensors performance. This means that it is difficult to use the same camera for daylight and IR imaging.

Figure 4B:
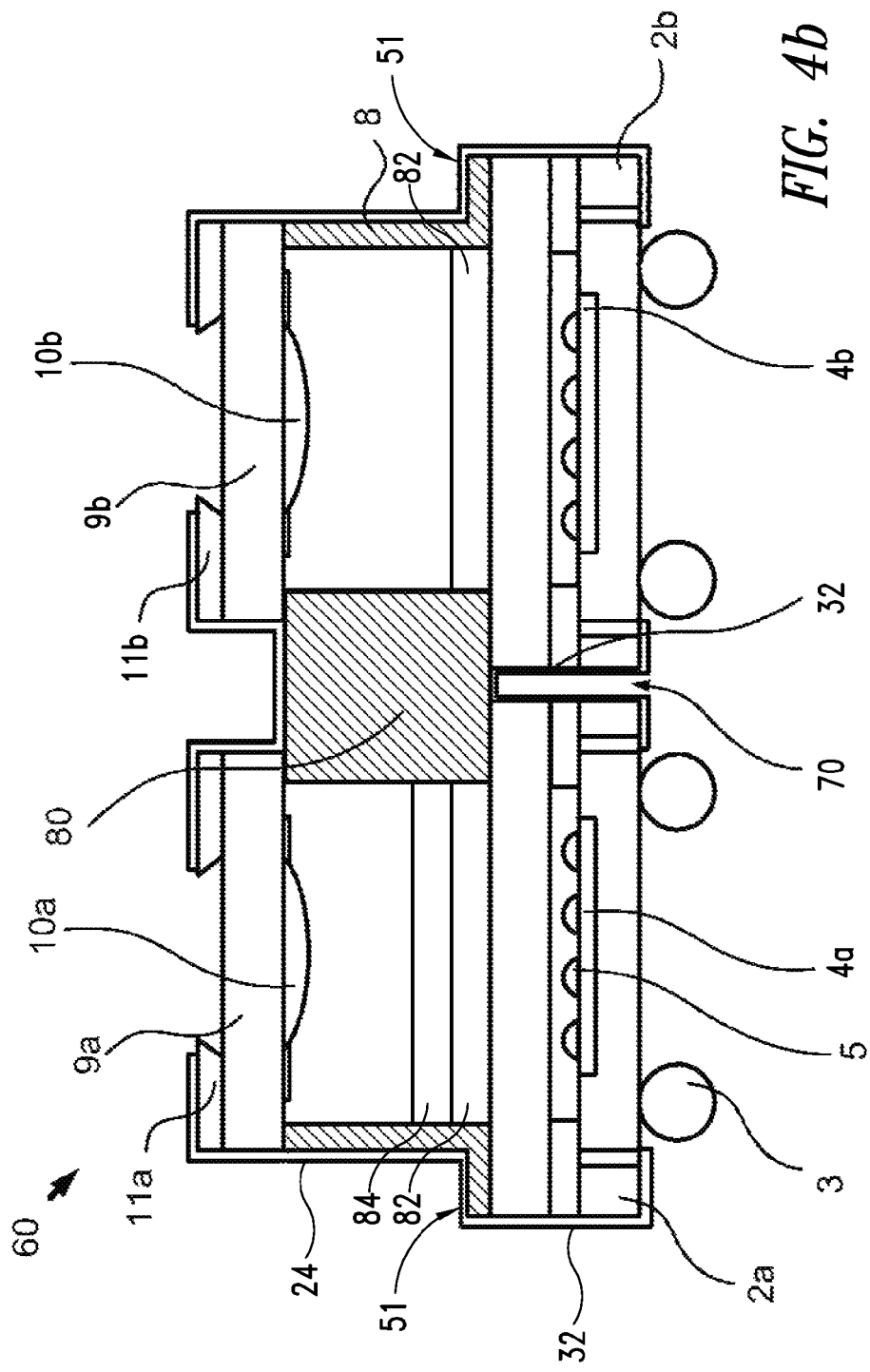

The sensor arrays 4*a*, 4*b*, 4*c*, 4*d* of this embodiment each have a single color filter 82 in front of them (FIG. 4*b*). Also, three of the sensor arrays 4*a*, 4*c*, 4*d* each have a single IR filter 84 in front of them, and one, 4*b*, does not have the IR filter. The final image is achieved by juxtaposing and combining the images from the three sensor arrays 4*a*, 4*c*, and 4*d*. The resolution of the final image is the same as that of the individual sensor arrays 4*a*, 4*c* and 4*d*.

To achieve the same final image resolution with a single sensor array 4 would mean enlarging the sensor array 4 with the consequence of increasing the distance between the sensor array 4 and the focusing lens assembly 10. This would then increase the height of the module which is undesirable. This would also impose other constraints concerning the geometry of the focusing lens assembly, increasing the cost thereof. Therefore the configuration of this embodiment greatly increases the image resolution without the penalty of height increase, making it suitable for situations where these are at a premium.

Furthermore, because one of the sensor arrays has no IR filter, it is able to capture images using the IR part of the spectrum, making the camera module more versatile than classical camera modules.

The absence of the IR filter is not obligatory in as much as the possibility of the IR imaging can be sacrificed in exchange for different performance characteristics.

FIG. 4*b* represents a cross-section view of the camera module 60 of FIG. 4*a*.

Between the individual sensor dice 2*a*, 2*b*, a groove 70 has been cut in the manner described with reference to FIG. 2*b*. This groove extends upwards to the lower surface of the internal walls 80 of spacer element 8.

The internal walls 80 of the spacer element 8 are solid and, preferably opaque. In the situation where the camera module 60 is a 2×2 matrix, the cut of step S3, which passes down through the optical element 8 has been performed every alternate row. For the rows above the internal wall 80 of the spacer element 8, the cut has been stopped at the top of the internal wall 80.

The outside of the periphery and the interior surface of the groove 70 have received metal coatings 24, 32 in the manner described before. Also the metal coating 24 extends over the upper surfaces of the aperture mask 11*a*, 11*b* and of the internal wall 80 of the spacer element 8.

The groove 70 between the sensor dice 2*a*, 2*b* is to prevent cross-talk between the sensor dice 2*a*, 2*b*. It may arise, depending on the characteristics of the sensor arrays 2*a*, 2*b* and on the specification of the overall module, that this is not necessary. In this case, the cutting of the groove and the associated coating step can simply be omitted.

The arrangement is similar for the other two sensor dice 2*c*, 2*d* and when viewed from 90° to the view shown here.

Figure 4C:
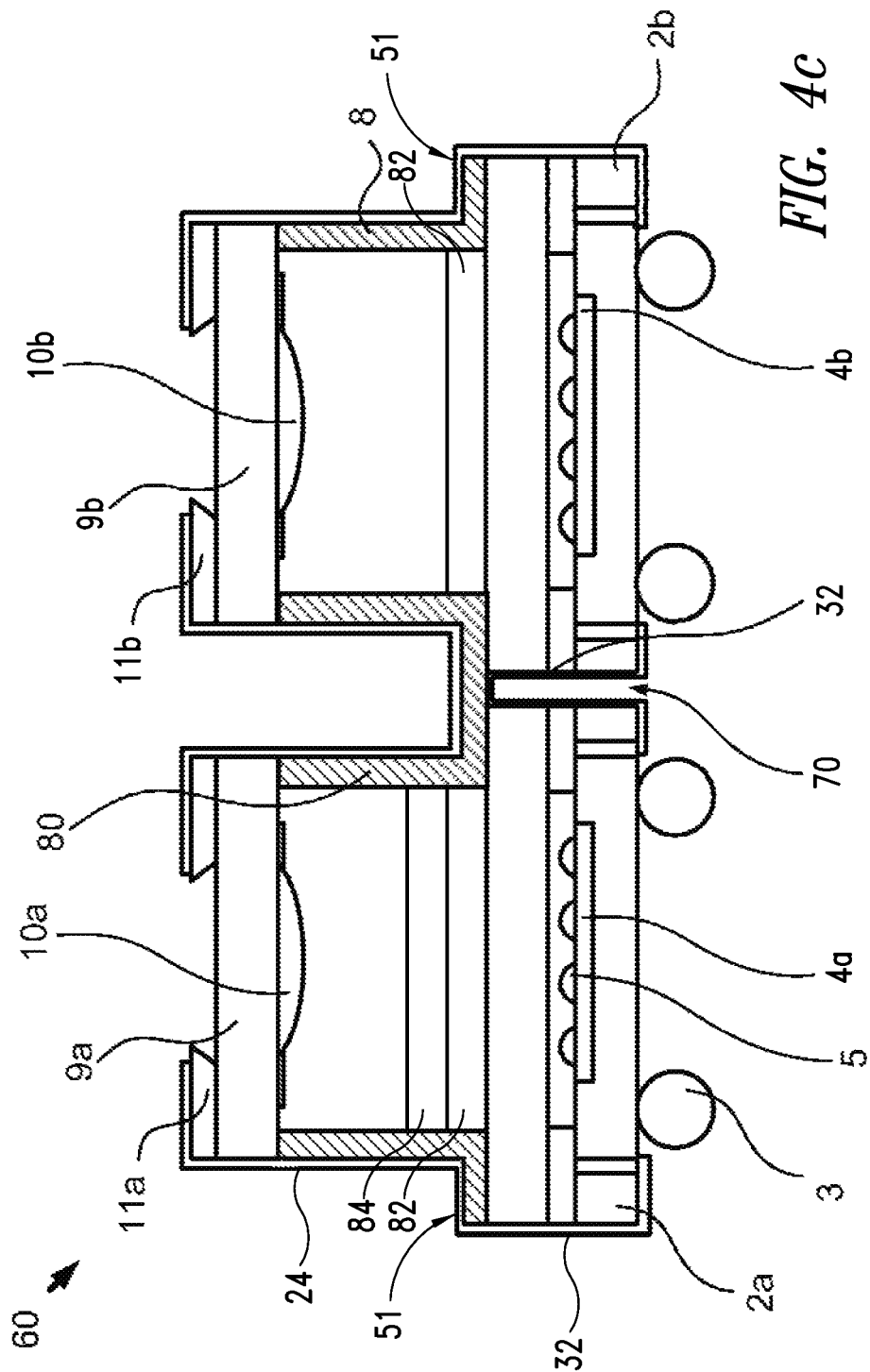

FIG. 4*c* represents a cross-section view of a variant the camera module 60 of FIG. 4*a*. The difference between this embodiment and that of FIG. 4*b* resides in that a cut has been also performed down through the internal wall 80 of the spacer element 8, much in the same way as it would for single-array camera modules.

Figure 5:
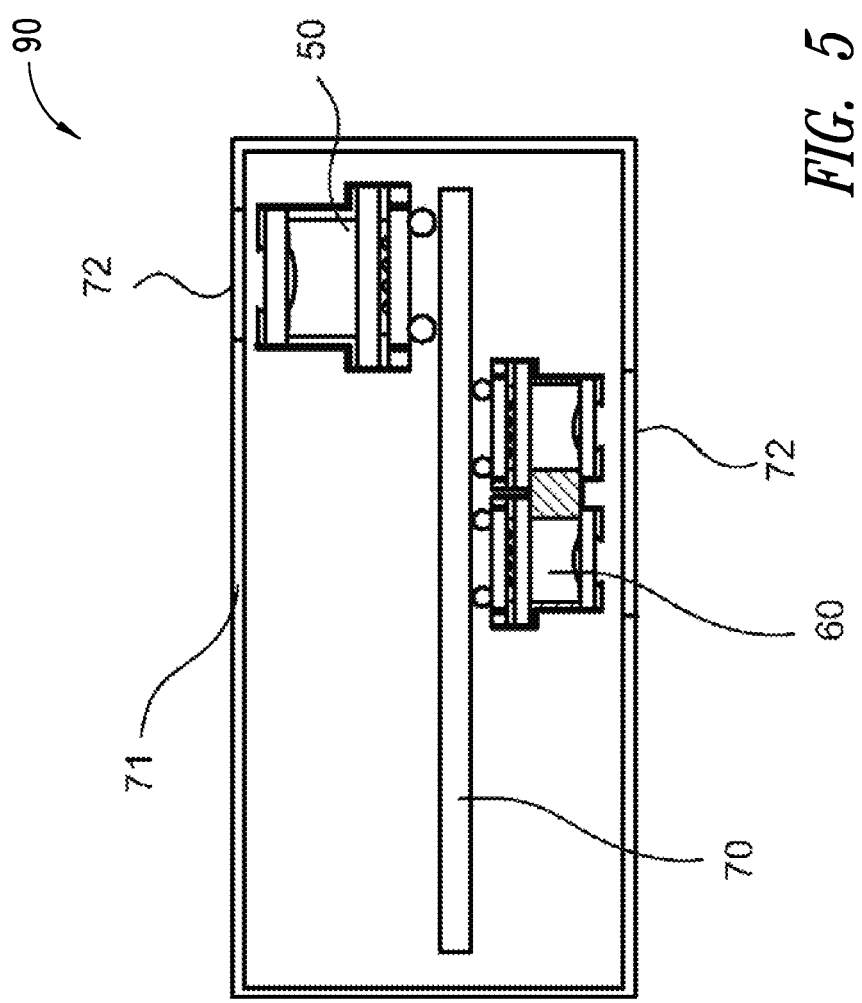
FIG. 5 represents equipment incorporating a camera module according to an embodiment.

FIG. 5 represents a piece of portable equipment 90 incorporating camera modules according to embodiments. Examples of such pieces of equipment are mobile phones and multimedia players.

A printed circuit board 70 has mounted on opposite faces a camera module 50 according to the embodiment of FIG. 3 and a camera module according to the embodiment of FIGS. 4*a*-4*b*.

The printed circuit board 70 and the two camera modules 50, 60 is enclosed in a casing 71 having transparent parts 72 arranged in front of the camera modules 50, 60.

The foregoing, with its features, aspects and purposes is given by way of illustration and not limitation. Indeed, it is not intended that the embodiments described be considered the only ones concerned by the present disclosure.

Indeed, the method described could be applied, with minor adaptation, to camera modules containing elements not described herewith, or, indeed, those lacking elements, for example the spacer element, the optical element or the cover glass.

A 4×4 matrix of sensor arrays has been described. However other rectangular arrays could be produced equally easily.

The equipment of FIG. 5 has been described with two camera modules placed facing opposite directions, the two modules being according to different embodiments. However it is possible to have more or fewer camera modules, and have them of the same type. Furthermore, these could be placed on the same side of the printed circuit board.

Having thus described at least one illustrative embodiment of the disclosure, various alterations, modifications and improvements will readily occur to those skilled in the art. Such alterations, modifications and improvements are intended to be within the spirit and scope of the disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A camera module, comprising:
   a first sensor die extending longitudinally along a plane and including a sidewall transverse to the plane;
   a glass plate coupled to the sensor die and including a sidewall transverse to the plane;
   a peripheral spacer coupled to the glass plate and including a sidewall transverse to the plane;
   a first optical element coupled to the peripheral spacer;
   a first metal layer covering the sidewalls of the first sensor die, glass plate, peripheral spacer and having a first portion covering the sidewall of the peripheral spacer and extending in a first direction transverse to the plane, a second portion covering the sidewall of the first sensor die and extending in a second direction transverse to the plane, and an outer surface with a shoulder extending from the first portion to the second portion in a direction substantially parallel to the plane of said sensor die.

2. The camera module of claim 1, wherein:
   said peripheral spacer has a shoulder extending in a direction parallel to the plane of said sensor die; and
   the shoulder of the first metal layer coats said shoulder of said peripheral spacer.

3. The camera module of claim 1, wherein the first sensor die has conductive columns connecting top and bottom surfaces of the first sensor die.

4. The camera module of claim 1, further comprising an aperture layer on the optical element.

5. The camera module of claim 1, further comprising:
   a plurality of pixel arrays;

a plurality of optical elements, including the first optical element, arranged in front of the pixel arrays, respectively; and a plurality of color filters arranged in front of said pixel arrays, respectively, wherein:

the peripheral spacer is arranged around and between said pixel arrays; and each of said color filters is adapted to transmit a single color and at least two of said color filters are configured to transmit different colors.

6. The camera module of claim 5, comprising a plurality of sensor dice, including the first sensor die, wherein said pixel arrays are on the sensor dice, respectively.

7. The camera module of claim 6, comprising a second metal layer that coats surfaces of said sensor dice that face each other.

8. The camera module of claim 5, further comprising an infrared filter positioned in front of a first one of the pixel arrays, wherein there is no infrared filter in front of a second one of said pixel arrays, such that said second one of the pixel arrays is configured to form images using infrared radiation.

9. A portable device, comprising:
a printed circuit board; and
a first camera module coupled to the printed circuit board and including:
a sensor die extending longitudinally along a plane and including a sidewall transverse to the plane;
a glass plate coupled to the sensor die and including a sidewall transverse to the plane;
a peripheral spacer coupled to the glass plate and including a sidewall transverse to the plane;
a first optical element coupled to the peripheral spacer;
a first metal layer covering the sidewalls of the first sensor die, glass plate, peripheral spacer and having a first portion covering the sidewall of the peripheral spacer and extending in a first direction transverse to the plane, a second portion covering the sidewall of the first sensor die and extending in a second direction transverse to the plane, and an outer surface with a shoulder extending from the first portion to the second portion in a direction substantially parallel to the plane of said sensor die.

10. The portable device of claim 9, wherein:
said peripheral spacer has a shoulder extending in a direction parallel to the plane of said sensor die; and
the shoulder of the first metal layer coats said shoulder of said peripheral spacer.

11. The portable device of claim 9, further comprising a second camera module coupled to the printed circuit board and including:
a plurality of pixel arrays;
a plurality of optical elements arranged in front of the pixel arrays, respectively; and
a plurality of color filters arranged in front of said pixel arrays, respectively, wherein:
the peripheral spacer is arranged around and between said pixel arrays; and
each of said color filters is adapted to transmit a single color and at least two of said color filters are configured to transmit different colors.

12. The portable device of claim 9, further comprising:
a plurality of pixel arrays;
a plurality of optical elements, including the first optical element, arranged in front of the pixel arrays, respectively; and
a plurality of color filters arranged in front of said pixel arrays, respectively, wherein:
the peripheral spacer is arranged around and between said pixel arrays; and
each of said color filters is adapted to transmit a single color and at least two of said color filters are configured to transmit different colors.

13. The portable device of claim 12, wherein said pixel arrays are on separate sensor dice.

14. The portable device of claim 13, wherein the first camera module includes a second metal layer that coats surfaces of said sensor dice that face each other.

15. The portable device of claim 12, further comprising an infrared filter positioned in front of a first one of the pixel arrays, wherein there is no infrared filter in front of a second one of said pixel arrays, such that said second one of the pixel arrays is configured to form images using infrared radiation.

16. The portable device of claim 9, wherein the sensor die includes:
top and bottom surfaces coupled to each other by the sidewall of the sensor die; and
a conductive column extending between the top and bottom surfaces of the sensor die, wherein the metal layer is electrically coupled to the conductive column and forms a Faraday cage.

17. The portable device of claim 9, wherein:
the first optical element includes a lens assembly;
the first camera module includes an aperture layer having a sidewall and an aperture aligned with the lens assembly; and
the metal layer coats the sidewall of the aperture layer and extends from the aperture layer to the sensor die.

18. The portable device of claim 17, wherein:
the aperture layer has a top surface transverse to the sidewall of the aperture layer and the metal layer coats the top surface of the aperture layer.

19. The camera module of claim 3, wherein the metal layer is electrically coupled to at least one of the conductive columns and forms a Faraday cage.

20. The camera module of claim 1, wherein the first optical element includes a lens assembly, the camera module comprising an aperture layer having a sidewall and an aperture aligned with the lens assembly, wherein the metal layer coats the sidewall of the aperture layer and extends from the aperture layer to the sensor die.

21. The camera module of claim 20, wherein:
the aperture layer has a top surface transverse to the sidewall of the aperture layer and the metal layer coats the top surface of the aperture layer.

* * * * *